(12) United States Patent
Anwar et al.

(10) Patent No.: US 7,700,419 B2
(45) Date of Patent: Apr. 20, 2010

(54) INSULATED GATE SILICON NANOWIRE TRANSISTOR AND METHOD OF MANUFACTURE

(75) Inventors: Abul F Anwar, Storrs, CT (US); Richard T. Webster, Bedford, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 105 days.

(21) Appl. No.: 12/229,051

(22) Filed: Aug. 14, 2008

(65) Prior Publication Data
US 2008/0311712 A1    Dec. 18, 2008

Related U.S. Application Data

(62) Division of application No. 11/208,127, filed on Aug. 18, 2005, now Pat. No. 7,485,908.

(51) Int. Cl.
*H01L 21/84* (2006.01)
(52) U.S. Cl. .............................. 438/151; 257/E21.179
(58) Field of Classification Search ......... 438/151–166; 257/E21.179
See application file for complete search history.

(56) References Cited

U.S. PATENT DOCUMENTS 7,425,491 B2 *   9/2008   Forbes .................. 438/301

* cited by examiner

*Primary Examiner*—Richard A. Booth
(74) *Attorney, Agent, or Firm*—AFMCLO/JAZ; Robert V. Klauzinski

(57) ABSTRACT

An insulated gate silicon nanowire transistor amplifier structure is provided and includes a substrate formed of dielectric material. A patterned silicon material may be disposed on the substrate and includes at least first, second and third electrodes uniformly spaced on the substrate by first and second trenches. A first nanowire formed in the first trench operates to electrically couple the first and second electrodes. A second nanowire formed in the second trench operates to electrically couple the second and third electrodes. First drain and first source contacts may be respectively disposed on the first and second electrodes and a first gate contact may be disposed to be capacitively coupled to the first nanowire. Similarly, second drain and second source contacts may be respectively disposed on the second and third electrodes and a second gate contact may be disposed to be capacitively coupled to the second nanowire.

6 Claims, 3 Drawing Sheets

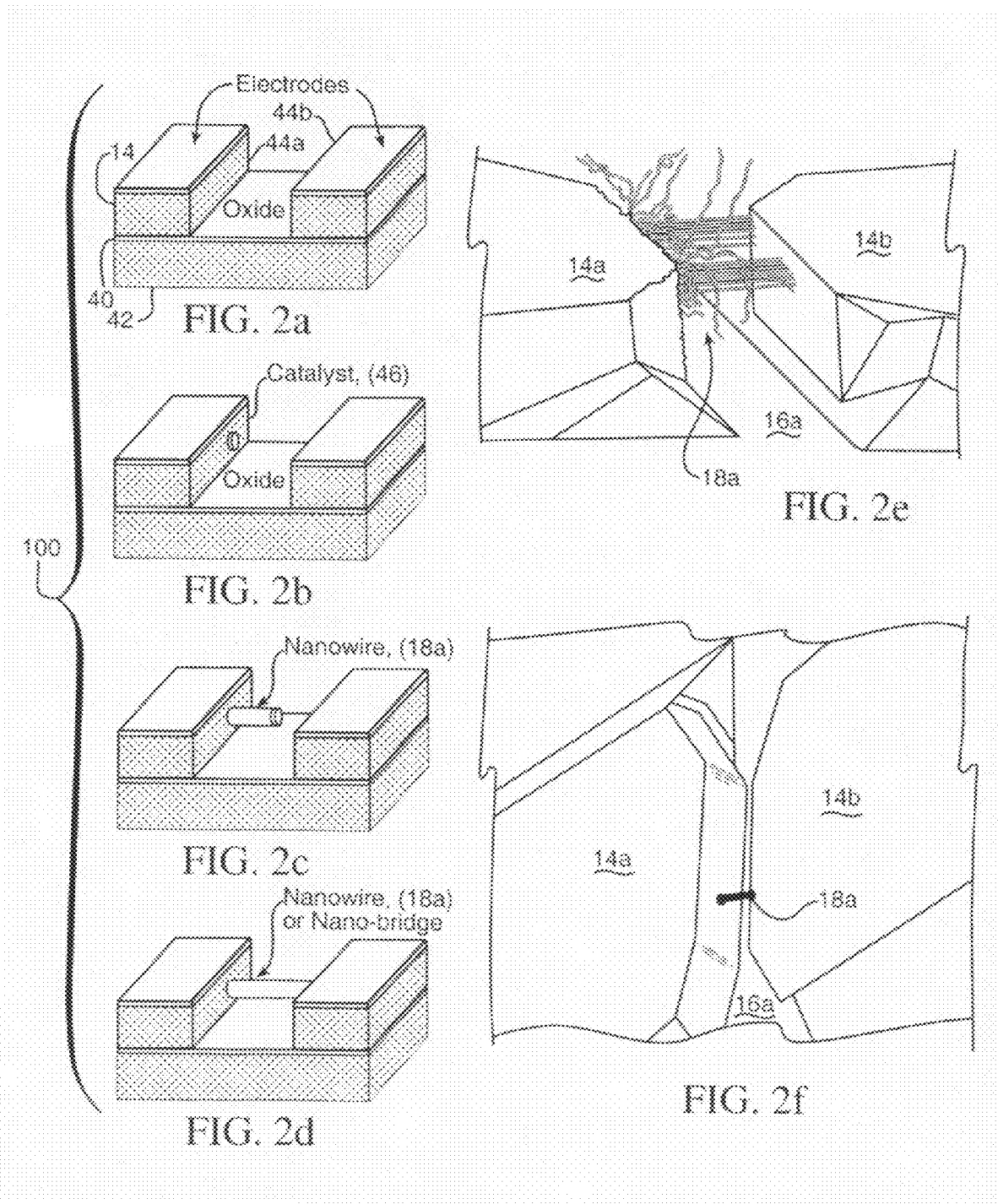

INSULATED GATE SILICON NANOWIRE TRANSISTOR AND METHOD OF MANUFACTURE

CROSS REFERENCE TO RELATED APPLICATION

This application is a divisional of and claims the benefit of application number 11/208,127, filed Aug. 18, 2005 now U.S. Pat. No. 7,485,908.

STATEMENT OF GOVERNMENT INTEREST

The invention described herein may be manufactured and used by or for the Government for governmental purposes without the payment of any royalty thereon.

FIELD OF THE INVENTION

The present invention relates generally to transistor structures and, more particularly, to an insulated gate silicon nanowire transistor structure.

BACKGROUND OF THE INVENTION

As is known, free-standing nanostructures are currently being extensively explored. These nanostructures are especially attractive for sensor applications because their high surface-to-volume ratio makes them very sensitive to charged species adsorbed on their surfaces. Lateral growth of carbon nanotubes between two electrodes during chemical vapour deposition (CVD) has been realized for which a lateral electric field applied between the electrodes attracts the growing nanotube towards the counter-electrode. Although the potential of carbon nanotubes for applications such as gas-sensing field-effect devices has been demonstrated, the difficulty of synthesizing only metallic or only semiconducting nanotubes and the difficulty of modifying nanotube surfaces have limited their development as nanosensors.

Lateral growth of GaAs nanowhiskers by metalorganic vapour phase epitaxy (MOVPE) from vertical ridges on a GaAs substrate using Au nanoparticles as the catalyst has also been demonstrated. However, the properties of the mechanical connection between a bridging nanowire and the vertical sidewall have not been favorable.

Nanowires made of silicon are especially attractive because of silicon's compatibility with existing IC processes. Moreover, the chemical and physical properties of silicon can be controlled to adjust the device sensitivity, and silicon nanowires can be selectively grown. Using silicon allows the vast knowledge of silicon technology to be applied to applications such as sensing. Using semiconductor nanowires, researchers have demonstrated electrical sensors for biological and chemical species, and designed a range of nanoelectronic and photonic devices in different material systems. In many of these demonstrations, nanowires were assembled after growth into parallel or crossed arrays by alignment aided by fluid flow or by applying electric fields. In other cases, electrical contacts were defined with electron-beam lithography on a few selected nanowires.

Although connecting electrodes to nanowires one at a time contributes to understanding the characteristics of nanowires and exploring novel device applications, it cannot be used for reproducible mass-fabrication of dense, low-cost device arrays. A massively parallel, self-assembly technique is needed to allow bridging of silicon nanowires between electrodes using only relatively coarse lithography principles.

It would, therefore, be desirable to overcome the aforesaid and other disadvantages.

SUMMARY OF THE INVENTION

In one aspect of the present invention, an insulated gate silicon nanowire transistor amplifier structure is set forth. The insulated gate silicon nanowire transistor amplifier structure includes a substrate formed of dielectric material. A patterned silicon material may be disposed on the substrate and has at least first, second and third electrodes uniformly spaced on the substrate by first and second trenches. A first nanowire may be formed in the first trench and is operative to electrically couple the first and second electrodes. Similarly, a second nanowire may be formed in the second trench and is operative to electrically couple the second and third electrodes. First drain and first source contacts may be respectively disposed on the first and second electrodes. Further, a first gate contact is disposed to be capacitively coupled to the first nanowire.

The transistor amplifier structure further includes second drain and second source contacts, which are respectively disposed on the second and third electrodes. A second gate contact is also disposed to be capacitively coupled to the second nanowire. In this arrangement, the first drain contact is coupled to receive current from a first source and the second gate contact is coupled to receive current from a second source for generating an electric field sufficient to permit current from the first source to flow through the first and second nanowires and simultaneously providing an amplified output realized between the first gate and first source contacts.

In another aspect of the present invention, a method of forming an insulated gate silicon nanowire transistor amplifier structure is set forth. The method includes disposing a silicon layer on a dielectric substrate and patterning the silicon layer for forming at least first, second and third electrodes separated by first and second trenches. A first nanowire may be grown laterally in the first trench for electrically coupling the first and second electrodes. Similarly, a second nanowire may be grown laterally in the second trench for electrically coupling the second and third electrodes. The first and second nanowires may thereafter be encapsulated in a first dielectric material.

The method further includes disposing first drain and first source contacts on respective first and second electrodes. Similarly, the second drain and second source contacts may be disposed on respective second and third electrodes. A first gate contact may be disposed on the first dielectric material in close proximity to the first nanowire and a second gate contact may be disposed on the first dielectric material in close proximity to the second nanowire. In this arrangement, the first drain, source and gate contacts serve as an interface to a first transistor stage of the transistor amplifier structure and the second drain, source and gate contacts serve as an interface to a second transistor stage of the transistor amplifier structure.

BRIEF DESCRIPTION OF THE DRAWINGS

The invention will be more fully understood from the following detailed description taken in conjunction with the accompanying drawings, in which:

FIGS. 2a-2f show a process of forming one or more nanowires in a first trench located on a first transistor stage of the insulated gate silicon nanowire transistor amplifier structure of FIG. 1 and exemplary images of the one or more nanowires.

DETAILED DESCRIPTION OF THE INVENTION

The present invention provides an insulated gate silicon nanowire transistor amplifier structure and method of manufacturing the same. The insulated gate silicon nanowire transistor amplifier structure is constructed and arranged to permit operation in the THz range by ballistically transporting electrons through a number of nanowires located within the transistor structure, as will be described in further detail below.

Figure 1:
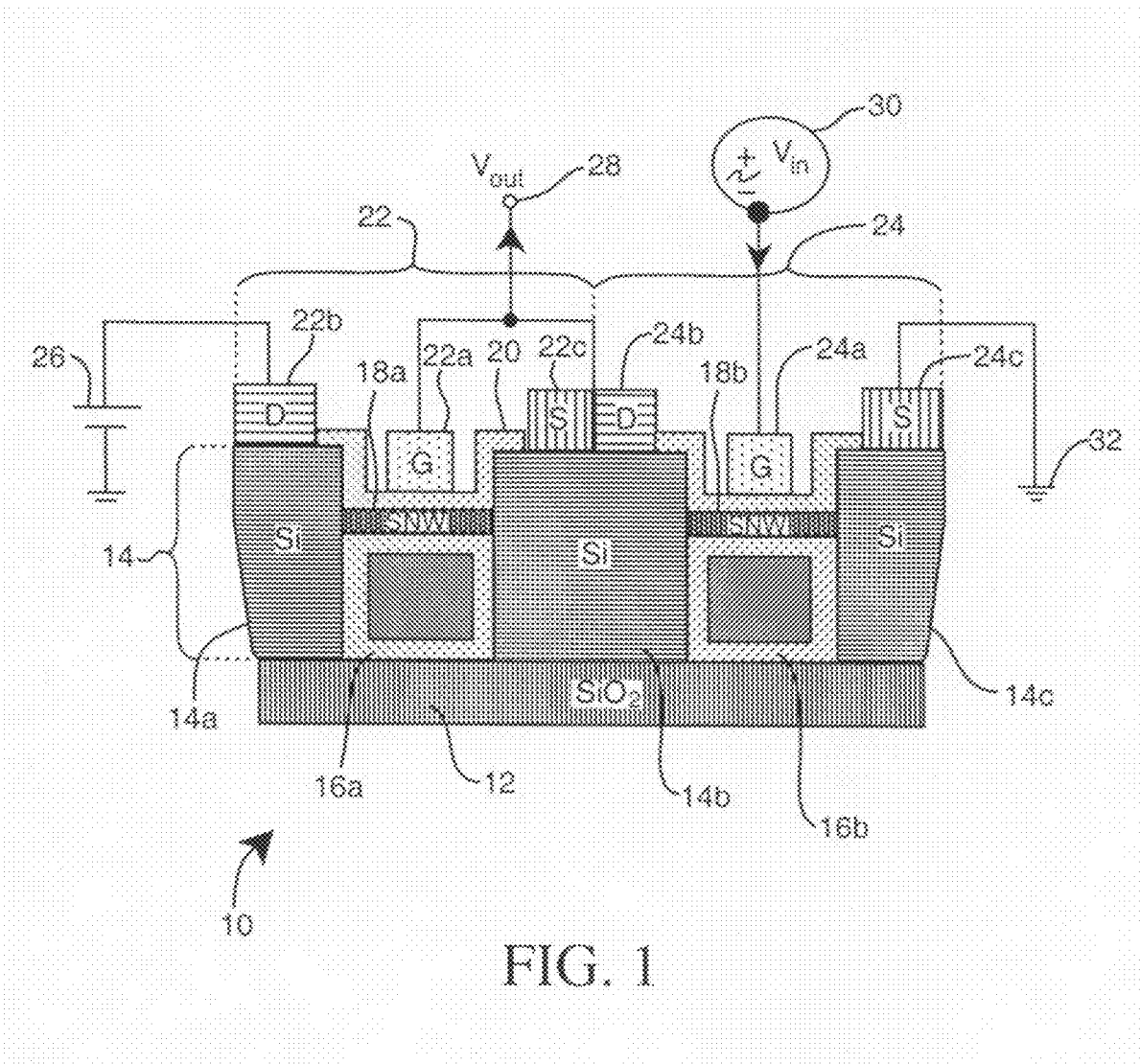
FIG. 1 shows an embodiment of the insulated gate silicon nanowire transistor amplifier structure in accordance with the present invention.

Referring now to FIG. 1, shown is one embodiment of the insulated gate silicon nanowire transistor amplifier structure 10 in accordance with principles of the present invention. In the illustrative embodiment, the insulated gate silicon nanowire transistor amplifier structure 10 includes a substrate 12. In an embodiment, the substrate 12 can be formed of silicon oxide, sapphire, glass or other sturdy dielectric materials or a layer of such materials deposited on a silicon substrate. A silicon layer 14 may be disposed on the substrate 12, which wafer 14 may be patterned to form at least first, second and third electrodes 14a, 14b, 14c separated by first and second trenches 16a, 16b. The silicon wafer 14 may be patterning using any one of many known methods in the wafer fabrication and processing arts for patterning silicon wafers, such as etching or micromachining. In the illustrative embodiment, the trenches 16a, 16b are etched down in the silicon wafer 14 to a depth which substantially exposes the dielectric substrate 12, e.g., silicon oxide.

At least a first nanowire 18a may be formed in the first trench 16a, which is operative to electrically couple the first electrode 14a to the second electrode 14b. Similarly, at least a second nanowire 18b may be formed in the second trench 16b, which is operative to electrically couple the second electrode 14b to the third electrode 14c. The formation of the first and second nanowires 18a, 18b in the respective first and second trenches 16a, 16b will be described below in further detail in connection with FIGS. 2a through 2f. It should be understood that the first nanowire 18a may include a plurality of nanowires disposed in parallel to electrically couple the first and second electrodes 14a, 14b for which the greater the number of nanowires disposed between the first and second electrodes the greater the number of electrons that may be transported between the first and second electrodes 14a, 14b (i.e., increased current flow). It should also be understood and similar to that described above, the second nanowire 18b may also include a plurality of nanowires disposed in parallel to electrically couple the second and third electrodes 14b and 14c for which the greater the number of nanowires disposed between the second and third electrodes 14b, 14c the greater the number of electrons that may be transported between the second and third electrodes 14b, 14c (i.e., increased current flow).

In an embodiment, the first and second nanowires 18a, 18b may include at least one of or a combination of silicon, carbon, gallium nitride, gallium arsenide, aluminum gallium arsenide, or related semiconductor alloys. In another embodiment, the first and second nanowires may include Ti- and Au-nucleated Si nanowires.

In the exemplary embodiment, at least the first and second nanowires 18a, 18b may be encapsulated in a first dielectric material 20, which serves to insulate and protect the first and second nanowires 18a, 18b and well as to provide a suitable platform to support respective first and second gate contacts 22a, 24a respectively disposed in close proximity to the first and second nanowires 18a, 18b. The insulated gate silicon nanowire transistor amplifier structure 10 further includes first drain and source contacts 22b, 22c which are respectively disposed on the first and second electrodes 14a, 14b. Similarly, the illustrated gate silicon nanowire transistor amplifier structure 10 also includes second drain and source contacts 24b, 24c, which are respectively disposed on the second and third electrodes 14b, 14c. In an embodiment, the first gate, drain and source contacts 22a, 22b, 22c serve as an interface to a first transistor stage 22 of the transistor amplifier structure 10 and the second gate, drain, and source contacts 24a, 24b, 24c serve as an interface to a second transistor stage 24 of the transistor amplifier structure 10. Further in the illustrative embodiment, the first source contact 22c of the first transistor stage 22 and the second drain contact 24b of the second transistor stage 24 are disposed in a contact relationship on the second electrode 14b.

In an embodiment, the first drain contact 22b of the first transistor stage 22 is adapted to receive current from a first power source 26, which may include a direct current source (e.g., a battery). The first gate contact 22a may also be coupled to the first source contact 22c, which first source contact 22c is itself coupled to the second drain contact 24b, as described above, to provide an output port 28 of the insulated gate silicon nanowire transistor amplifier structure 10 of the present invention. Further, the second gate contact 24a may be adapted to receive an input voltage and/or control signals from a second power source 30 (e.g., alternating current source). Furthermore, the second source contact 24c may be coupled to ground 32.

Referring to FIGS. 2a through 2d, shown is a method 100 for growing the first nanowire(s) 18a associated with the first transistor stage 22 of the transistor amplifier structure 10 and it should be understood that the second nanowire(s) 18b associated with the second stage 24 of the transistor amplifier structure 10 may be similarly formed. In particular, FIG. 2a shows a thermal oxide layer 40 grown on a silicon wafer 42, which may be patterned to serve as an etch mask for the subsequent silicon wafer etching process. The mask edges should be carefully aligned along the intersections of the vertical planes with the top surface so that the subsequently etched first trench 16a is bounded by two adjacent vertical surfaces 44a, 44b. The oxide may be etched using reactive ion etching (RIE) with $CHF_3$ and Ar gases, and the first trenches 16a may be formed in the silicon wafer 14 by etching the silicon wafer in 44% KOH—$H_2O$ at 110° C. for 1 min, which creates the first trench 16a having dimensions of approximately 8 μm deep and 2-15 μm wide.

In FIG. 2b, after forming the vertical surfaces 44a, 44b and cleaning the sample, a nucleating metal catalyst 46 of Ti or Au of the order of 1 nm thick may be deposited by electron-beam evaporation onto one of the vertical surfaces, such as surface 44a of the etched trench 16a. The vertical surface 44a of the etched trench 16a may be positioned at an angle of 45° from the normal to deposit the catalyst onto the vertical surface 44a of the trench 16a so that the nanowire(s) will grow preferentially from the vertical surface 44a to the opposing vertical surface 44b.

The structure 10a may thereafter be transferred through air to a lamp-heated CVD reactor (not shown), in which the structure 10a is supported by an SiC-coated graphite plate (not shown) of moderate thermal mass. The structure 10a may be annealed in hydrogen at approximately 625 degrees Celsius to form Au—Si alloy nanoparticles and to reduce the native oxide on the Ti and form $TiSi_2$. The temperature may be increased to 625 degrees Celsius, and a mixture of $SiH_4$ and HCl may be introduced into the hydrogen ambient to grow the nanowire(s) 18a, as shown in FIG. 2c. The total pressure may be controlled at 10 Torr, with 3 slm of hydrogen, 15 sccm of $SiH_4$, and 15 sccm of HCl.

Figure 3A:
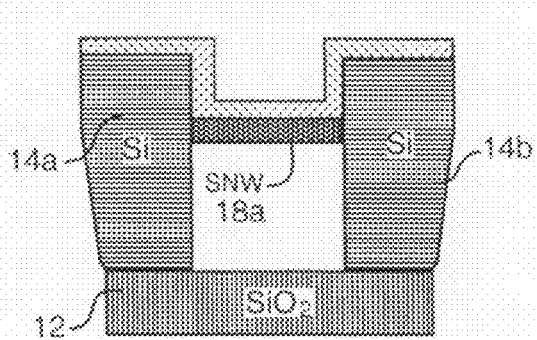
FIGS. 3a-3e show one embodiment of a method of forming a first transistor stage of the insulated gate silicon nanowire transistor amplifier structure of FIG. 1.
Figure 3B:
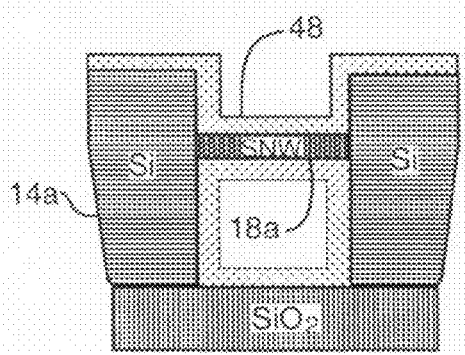
Figure 3C:
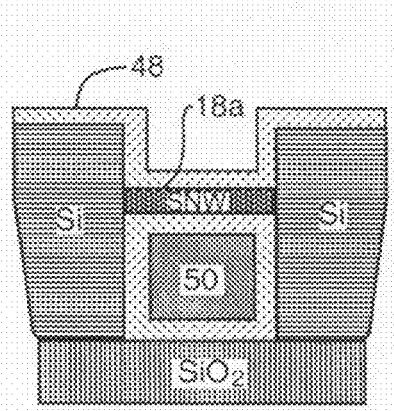
Figure 3D:
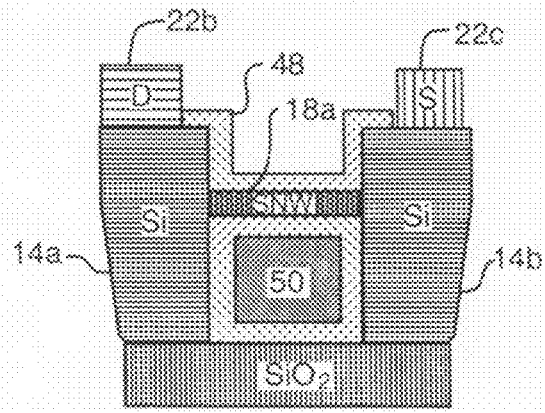
Figure 3E:
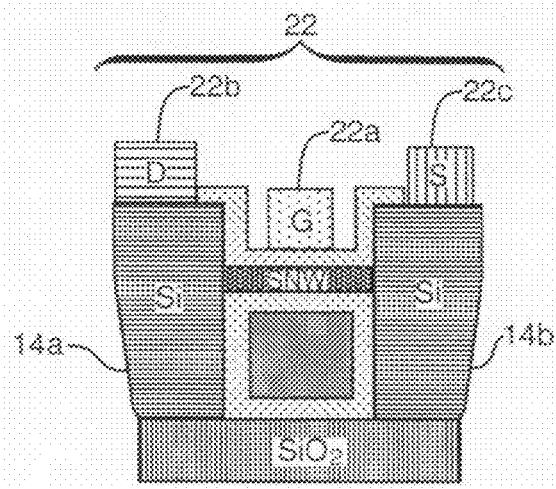

As shown in FIG. 2d, the nanowire(s) 18a may be grown for approximately 30 minutes or until the nanowire 18a extends laterally towards and couples with the opposing vertical sidewall 44b, which said another way forms a nanowire bridge across the trench 16a. FIG. 2e shows a scanning electron microscope image of one embodiment of the present invention in which the first trench 16a includes the first nanowire 18a as including a plurality of nanowires disposed to couple the first and second electrodes 14a, 14b. Similarly, FIG. 2f shows another scanning electron microscope image of another embodiment of the present invention in which the first trench 16a includes the first nanowire 18a as including a unitary nanowire disposed to couple the first and second electrodes 14a, 14b Referring to FIGS. 3a and 3b, after forming the first nanowire 18a (i.e., which may includes one or more nanowires) in the first trench 16a, which is electrically disposed to couple the first and second electrodes 14a, 14b, the method of the present invention includes encapsulating the first nanowire 18a in a first dielectric material 48. In an embodiment, the first dielectric material 48 may include silicon dioxide or silicon nitride. In FIG. 3c, after encapsulating the first nanowire 18a in the first dielectric material 48, the method further includes substantially filling the remaining portions of the first trench 16a with a second dielectric material 50. In an embodiment, the second dielectric material 50 may include silicon dioxide or silicon nitride. In FIG. 3d, the first drain and first source contacts 22b, 22c may be formed on the respective first and second electrodes 14a, 15b using any one of a number of commonly known deposition processes. Finally, in FIG. 3e, the first gate contact 22a may be disposed on a portion of the first dielectric material 48, which operates to encapsulate the first nanowire 18a, to form the first transistor stage 22 of the transistor amplifier structure 10. As mentioned above, it should be understood that the second transistor stage 24 of the transistor amplifier structure 10 may be similarly constructed and arranged as the first transistor stage 22. Further, in order to reduce processing steps and fabrication time, it should be understood that the second transistor stage 24 of the transistor amplifier structure 10 may be simultaneously fabricated as the first transistor stage 22 of the transistor amplifier structure 10.

Referring again to FIG. 1, during operation of the insulated gate silicon nanowire transistor amplifier structure 10 of the present invention, an input voltage is received at the second gate contact 24a, which operates to generate an electric field between the second gate contact 24a and the second nanowire 18b for capacitively coupling the second gate contact 24a and the second nanowire 18b to permit electrons to flow through the second nanowire 18b. This phenomena of electric field control of the second nanowire 18b further permits current to be sourced from the first power source 26 (i.e., D.C. source) for providing a ballistic electron transport or current flow from the first power source 26 through the first drain contact 22b; first electrode 14a; first nanowire 18a, second electrode 14b; second nanowire 18b, third electrode 14c and out of the transistor amplifier structure 10 to ground 32, via the second source contact 24c. At the same time, an amplified output voltage may be realized at the output part 28 of the transistor amplifier structure 10. In an embodiment, the output voltage is directly proportional to the magnitude of the current flowing through the transistor amplifier structure 10, as sourced by the first power source 26 and as described above. Since the magnitude of the current flowing through the transistor amplifier structure 10 is controlled by the magnitude of the input voltage received at the second gate electrode 24a from the second power source 30, it logically follows that the output voltage realized at output port 28 is proportional to the magnitude if the input voltage signal received at the second gate contact 24a.

It should be understood that the number of the first and second nanowires 18a, 18b can be increased to increase the number of parallel pathes, thereby increasing the current flowing at a given bias voltage through the transistor amplifier structure 10, which may translate into an increase in the amplified output voltage realized at the output port 28. It should also be understood that the transistor amplifier structure 10 of the present invention is fully scaleable and may be expanded to include additional transistor stages (not shown) without departing from the spirit and scope of the present invention.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method of forming an insulated gate silicon nanowire transistor amplifier structure, comprising:
   (a) disposing a silicon layer on a dielectric substrate;
   (b) patterning the silicon layer for forming at least first, second and third electrodes separated by first and second trenches;
   (c) growing laterally at least a first nanowire in the first trench for electrically coupling the first and second electrodes;
   (d) growing laterally at least a second nanowire in the second trench for electrically coupling the second and third electrodes;
   (e) encapsulating the first and second nanowires in a first dielectric material;
   (f) disposing first drain and first source contacts on respective first and second electrodes;
   (g) disposing second drain and second source contacts on respective second and third electrodes;
   (h) disposing a first gate contact on the first dielectric material in close proximity to the first nanowire; and
   (i) disposing a second gate contact on the first dielectric material in close proximity to the second nanowire, wherein the first drain, source and gate contacts serve as an interface to a first transistor stage of the transistor amplifier structure and the second drain, source and gate contacts serve as an interface to a second transistor stage of the transistor amplifier structure.

2. The method of claim 1, further including substantially filling the first and second trenches with a second dielectric material.

3. The method of claim 2, wherein after the step (e), the method further includes removing a predetermined portion of the first dielectric material from the first, second and third electrodes to permit disposal of the first and second drain and source contacts.

4. The method of claim 3, further including coupling the first gate, first source and second drain contacts for defining an output.

5. The method of claim 4, further including coupling the first drain contact to receive input current from a first source.

6. The method of claim 5, further including coupling the second gate contact to receive input current from a second source, wherein input current from the second source induces an electric field between the second gate contact and the second nanowire to permit current from the first source to flow through at least the first and second nanowires for providing a proportional voltage at the output.

* * * * *